(12) United States Patent
Kim

(10) Patent No.: US 8,648,477 B2
(45) Date of Patent: *Feb. 11, 2014

(54) SEMICONDUCTOR CHIP, FILM SUBSTRATE, AND RELATED SEMICONDUCTOR CHIP PACKAGE

(75) Inventor: Dong-han Kim, Osan-si (KR)

(73) Assignee: Samsung Electronics Co., Ltd., Samsung-ro, Yeongtong-gu, Suwon-si, Gyeonggi-do (KR)

(*) Notice: Subject to any disclaimer, the term of this patent is extended or adjusted under 35 U.S.C. 154(b) by 597 days.

This patent is subject to a terminal disclaimer.

(21) Appl. No.: 12/836,321

(22) Filed: Jul. 14, 2010

(65) Prior Publication Data

US 2011/0006442 A1    Jan. 13, 2011

Related U.S. Application Data

(63) Continuation of application No. 11/589,138, filed on Oct. 30, 2006, now Pat. No. 7,763,986.

(30) Foreign Application Priority Data

Dec. 19, 2005 (KR) .............................. 2005-125484

(51) Int. Cl.
*H01L 23/48* (2006.01)

(52) U.S. Cl.
USPC 257/786; 257/773; 257/E23.01; 257/E23.079; 349/150; 349/151

(58) Field of Classification Search
USPC ................ 257/773, 786, E23.01, E23.079; 349/150, 151
See application file for complete search history.

(56) References Cited

U.S. PATENT DOCUMENTS

| | | | |
|---|---|---|---|
| 4,386,389 A | 5/1983 | Proebsting | |
| 4,967,261 A | 10/1990 | Niki et al. | |
| 5,016,082 A | 5/1991 | Roth | |
| 5,406,312 A | 4/1995 | Arimoto | |
| 5,734,406 A | 3/1998 | Nakamura et al. | |
| 5,838,627 A * | 11/1998 | Tomishima et al. | 365/230.03 |
| 6,020,867 A | 2/2000 | Shimada et al. | |
| 6,054,975 A | 4/2000 | Kurokawa et al. | |
| 6,271,572 B1 | 8/2001 | Fujita | |
| 6,608,368 B2 | 8/2003 | Ohashi | |
| 2004/0172605 A1 * | 9/2004 | Kuge et al. | 716/1 |
| 2005/0104832 A1 | 5/2005 | Lee et al. | |
| 2008/0128902 A1 | 6/2008 | Chung et al. | |

FOREIGN PATENT DOCUMENTS

| | | |
|---|---|---|
| JP | 03-218062 | 9/1991 |
| JP | 05-136206 | 6/1993 |
| JP | 06-297765 | 10/1993 |
| JP | 11-202358 | 7/1999 |
| JP | 2005-136432 | 5/2005 |
| JP | 2005-268281 | 9/2005 |
| KR | 1020050048409 | 5/2005 |

OTHER PUBLICATIONS

Quirk, et al., "Semiconductor Manufacturing Technology." pp. 587-588, Prentice-Hall, 2001.

* cited by examiner

*Primary Examiner* — Peniel M Gumedzoe
(74) *Attorney, Agent, or Firm* — Muir Patent Consulting, PLLC

(57) ABSTRACT

A semiconductor chip package including a film substrate and a semiconductor chip loaded on the semiconductor chip is provided. The semiconductor chip includes a plurality of input pads and a plurality of output pads. A power supply input pad of the input pads is formed at a different edge from an edge of the semiconductor chip where other input pads are formed. The film substrate includes input lines and output lines. The input lines of the film substrate are connected to the corresponding input pads of the semiconductor chip, and the output lines thereof are connected to the corresponding output pads of the semiconductor chip.

19 Claims, 6 Drawing Sheets

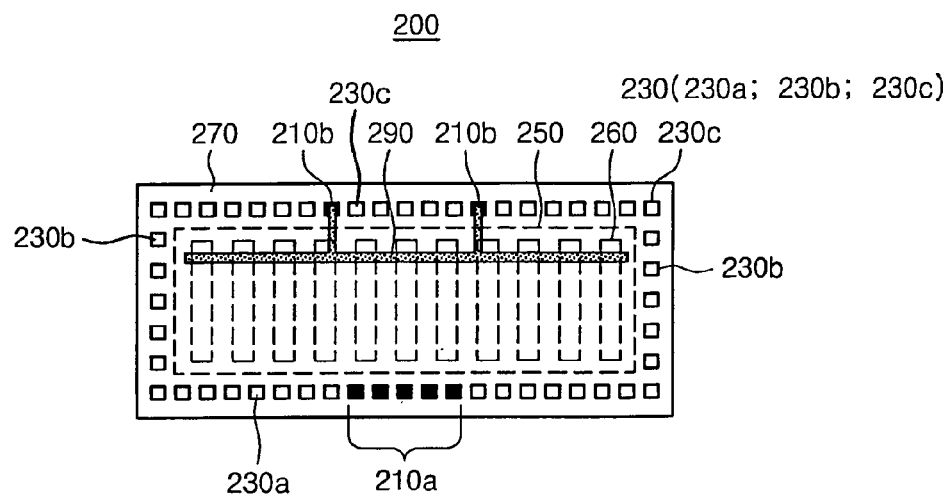
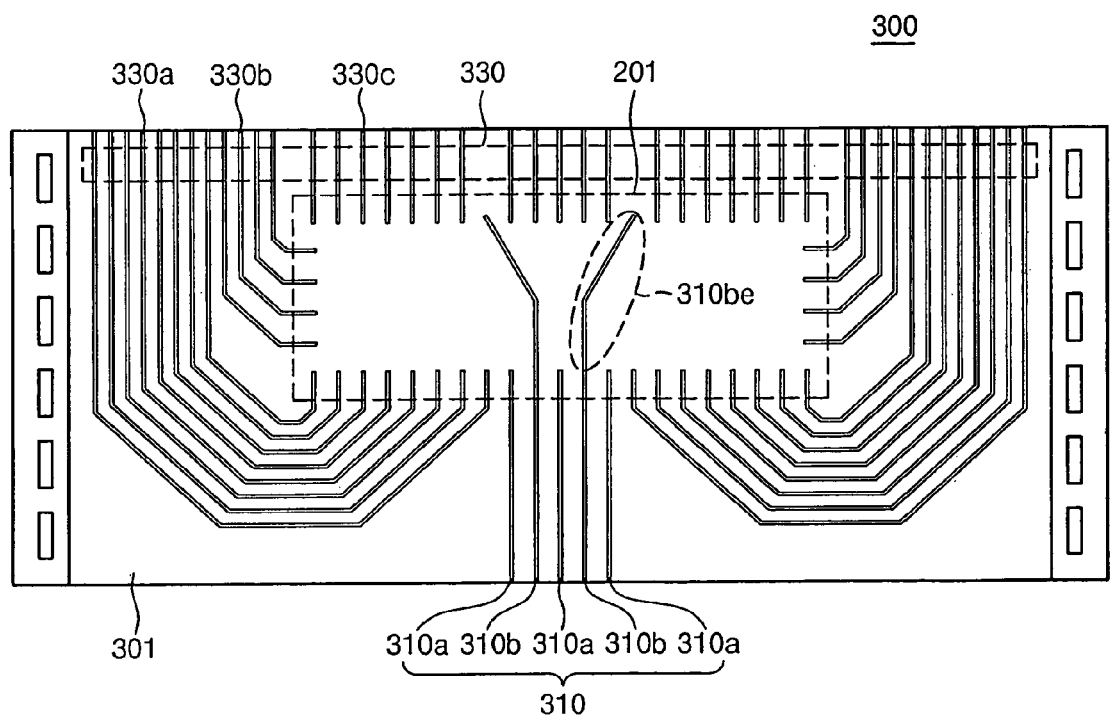

SEMICONDUCTOR CHIP, FILM SUBSTRATE, AND RELATED SEMICONDUCTOR CHIP PACKAGE

This application claims the benefit of priority of and is a Continuation of pending U.S. patent application Ser. No. 11/589,138 filed on Oct. 30, 2006, now U.S. Pat. No. 7,763,986 which claims the benefit of Korean Patent Application No. 2005-125484, filed Dec. 19, 2005, the disclosure of each of which is incorporated herein by reference in its entirety.

BACKGROUND OF THE INVENTION

1. Field of the Invention

Embodiments of the invention relate to a semiconductor chip, a film substrate, and a semiconductor chip package using the same. More particularly, embodiments of the invention relate to a chip-on-film semiconductor chip package in which the semiconductor chip is mounted on a film substrate.

2. Description of the Related Art

The complex sequence of fabrication processes used to manufacture semiconductor devices, as well as the technology associated with these processes, may be conceptually divided into the categories of wafer fabrication, packaging, and testing.

Wafer fabrication involves the application of multiple fabrication processes to a wafer serving as a substrate for a plurality of small chips or dies which are formed with identical electrical circuits. When completed, individual dies are fully functional by are not practically accessible to outside circuits and signals.

Testing involves a number of different procedures conducted to ensure the functional performance of each die. Individual test procedures are performed in relation to defined test standards or specifications that effectively separate defective dies from acceptable ones.

Packaging involves a collection of manufacturing processes that separate (e.g., cut) individual dies from a wafer, and then sealed the die in a plastic resin or ceramic before mounting it on a packaging substrate. Packaging allows external circuits and signals to practically interface with a semiconductor die and completes the fabrication of a commercial semiconductor device.

In the context of general packaging technology, various sealing materials have recently been developed as a substitute for the plastic resin or the ceramic. Additionally, various new package types have been developed which allow chips to remain exposed to air without the necessity of sealing them.

As noted above, package facilitates the practical electrical connection of a die with external circuits, provides mechanical and environmental protection, and also aids in the dissipation of heat inevitably generated during the use of the semiconductor device. Conventional techniques for providing an electrical connection to the die include wire bonding, solder bonding, tape automated bonding (TAB), and the like.

The development of contemporary consumer products has motivated improvements in the integration density, data storage capacity and/or operating speed of semiconductor devices. Corresponding demands for packaging technology that allow for dense integration of a semiconductor package having a thin profile and multiple pins has followed.

Various forms of conventional packaging make use of film mounting techniques such as, chip on film (COF) packaging. COF techniques have found particular application in the field of certain semiconductor devices commonly used to drive a display device, such as a Liquid Crystal Display (LCD) panel.

Referring to figures (FIGS. 1 and 2, a conventional COF package will now be described in some additional detail.

FIG. 1 is a schematic plan view of a conventional COF semiconductor package 10, and FIG. 2 is a schematic plan view of a semiconductor chip 20 mounted on the COF semiconductor package 10 of FIG. 1.

Referring to FIG. 1, COF semiconductor chip package 10 includes a semiconductor chip 20 and a film substrate 30 on which semiconductor chip 20 is mounted. Semiconductor chip 20 includes a core 25 having integrated circuits (IC), and a periphery 27 having input pads 21 and output pads 23.

Film substrate 30 includes input side copper foil patterns 31 and output side copper foil patterns 33. Input and output pads 21 and 23 of semiconductor chip 20 are electrically connected to corresponding input side and output side copper foil patterns 31 and 33 of film substrate 30 using bump bonding. In this manner, semiconductor chip 20 is mounted on and electrically connected to film substrate 30.

When semiconductor chip package 10 is applied to a display device, input side copper foil patterns 31 and output side copper foil patterns 33 of film substrate 30 are placed between a printed circuit board (PCB) and a display panel so as to be connected to the PCB and the display panel. The number of output pads 23 of semiconductor chip 20 is typically much greater than the number of input pads 21. Accordingly, input pads 21 are successively disposed on an edge of semiconductor 20 close to the PCB. (In the illustrated example, a lower side of semiconductor chip 20 is used as an input side edge).

In contrast, output pads 23 are successively disposed around the remaining edge portion of semiconductor chip 20, particularly the edge portion close to the display panel. (In the illustrated example, an upper side of semiconductor chip is used as an output side edge).

If the required number of output pads cannot be disposed on the output side edge, some of the output pads are disposed on side edges and even the input side edge. The output side copper foil patterns 33 other than those connected to the output pads 23 disposed on the upper side of semiconductor chip 20 must be bent to a certain extent in order to provide the necessary output signals to the attached display. (See, e.g., the output pads disposed at the lower, left and right sides of semiconductor chip 20 having angular or curved portions 33r1, and 33r2).

Potential problems caused by the positioning of the input and output pads on conventional semiconductor chip 20 will now be described with reference to FIG. 2. Referring to FIG. 2, input pads 21 include input pads 21a receiving various input signals, and input pads 21b receiving the power signals required to operate integrated circuits 26 forming semiconductor chip 20. Input pads 21a and 21b and the output pads 23 are electrically connected to integrated circuits 26 through conductive lines. A power supply line 29 communicates power around semiconductor chip 20 and is electrically connected to input pads 21b and integrated circuits 26.

In order to achieve stable and reliable operation of integrated circuits 26, power must be stably supplied. To this end, power supply line 29 must be formed with a sufficiently large physical dimensions (e.g., line width) to properly communicate power along its path (e.g., around the outer circumference of core 25 in the illustrated example). However, expanding the physical size of power supply line 29 and/or extending the length of its path around semiconductor chip 20 will tend to increase the overall size of the chip in order to maintain critical minimum separation distances between various semiconductor chip elements (e.g., the layout separation distance between power supply line 29 and input pads 21a or output pads 23, etc.).

SUMMARY OF THE INVENTION

In one embodiment, the invention provides a semiconductor chip comprising; a plurality of input pads, and a plurality of output pads. The input pads include a plurality of first input pads successively arranged proximate one side of the semiconductor chip, and a second input pad adapted to supply power to the semiconductor chip and spaced apart from the plurality of first input pads by at least one intervening output pads.

In another embodiment, the invention provides a semiconductor chip package comprising; a film substrate having formed thereon a plurality of input lines and a plurality of output lines, and a semiconductor chip mounted on the film substrate and including a plurality of input pads and a plurality of output pads respectively connected to the input lines and the output lines. The input pads comprise; a plurality of first input pads successively arranged proximate one side of the semiconductor chip, and a second input pad adapted to supply power to the semiconductor chip and spaced apart from the plurality of first input pads by at least one intervening output pads.

In another embodiment, the invention provides a semiconductor chip comprising; a pair of opposing lateral side edges, an input side edge and an opposing output side edge connecting the lateral side edges, and input pads disposed proximate the input side and output side edges, and comprising; a plurality of first input pads disposed on the input side edge, and a second input pad adapted to supply power and disposed on the output side edge.

In another embodiment, the invention provides a semiconductor chip package comprising; a film substrate comprising a mounting area adapted to receive a semiconductor chip, input lines extending in a first direction towards the mounting area, and output lines extending in a second direction opposite the first direction from the mounting area. The semiconductor chip package also comprises a semiconductor chip disposed on the film substrate in the mounting area and comprising; input and output pads respectively connected to the input lines and the output lines, wherein an first input pad disposed proximate an input side of the semiconductor chip and connected between an input line adapted to provide power to the semiconductor chip and a second input pad disposed proximate an output side of the semiconductor chip.

In another embodiment, the invention provides a film substrate comprising; a base substrate, input lines formed on the base substrate and extending in a first direction towards a mounting area adapted to receive a semiconductor chip, and output lines formed on the base substrate and extending in a second direction opposite the first direction from the mounting area, wherein at least one of the input lines comprises an extension portion extending through a substantially portion of the mounting area.

BRIEF DESCRIPTION OF THE DRAWINGS

FIG. 3 is a schematic plan view of a semiconductor chip according to one embodiment of the present invention;

FIG. 4 is a schematic plan view of a film substrate according to one embodiment of the present invention;

DESCRIPTION OF EMBODIMENTS

Figure 1:
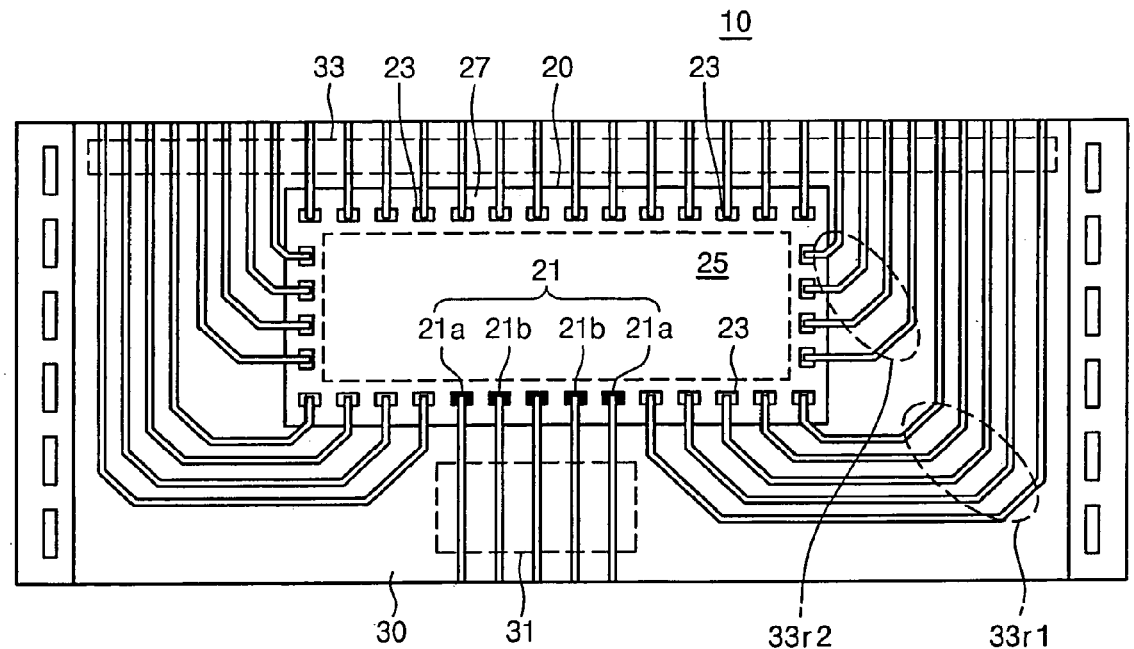
FIG. 1 is a schematic plan view of a conventional chip on film (COF) semiconductor chip package.

The present invention will now be described in the context of several exemplary embodiments. However, it should be noted that the invention is not limited to only the illustrated embodiments which are presented as teaching examples.

In the drawings, the relative size of various elements and components may have been exaggerated for the sake of improved clarity. It will also be understood that, although the terms first, second, third, and the like may be used herein to describe various members, elements, or portions thereof, these members, elements and portions thereof should not be limited by these terms. These terms are only used to distinguish one member or element from another member or element. Thus, a first member or element in one embodiment could be termed a second member or element without departing from the teachings of the present invention.

The relative terms mentioned in relation to members, elements or components, for example, "upper", "lower", "left", "right", "output side", "input side" or the like, are used to facilitate description on the members, elements or components with reference to accompanying drawings. Likewise, the relative terms mentioned in relation to members, elements or components, for example, "upper", "lower", "left", "right", "output side", "input side", or the like are used just to facilitate description on relations with another members, elements or components with reference to accompanying drawings. It will be easily understood that those relative terms may involve not only illustrated directions in the accompanying drawings but also other directions. For example, "a lower side" or "an input side" of a semiconductor chip (or a semiconductor chip package, or a film substrate) in the drawings may become "an upper side" or "an output side" when the semiconductor chip is flipped over or rotated at an angle of 180°. Therefore, it should be understood that the exemplary term "lower side" actually involves both "lower and upper sides", and the term "input side" involves both "input and output sides". In the same manner, if a semiconductor chip (or a semiconductor chip package, or a film substrate) is rotated to the left (or to the right) at a right angle, "an upper side" of the semiconductor chip becomes "a left side" (or "a right side"), "a left side" becomes "a lower side" (or "an upper side"), "a lower side" becomes "a right side" (or "a left side"), and "a right side" becomes "a left side" (or "a lower side"). Accordingly, it should be understood that the exemplary term "upper side" involves all the "upper, left and right sides".

The semiconductor chip described in the context of the following embodiments of the present invention may include integrated circuits constructed in various manners using a multiplicity of technologies and performing a variety of functions. Thus, while the description that follows is drawn to an exemplarily semiconductor chip adapted form use as a drive circuit in conjunction with a display device, other types of semiconductor devices may be readily substituted.

Also, although the semiconductor chip described hereafter is assumed to have certain packaging related attributes (e.g., a film substrate), other types of semiconductor devices formed using different types of packaging technology may be readily substituted.

Exemplary film substrate types useful in the context of a semiconductor chip package according to an embodiment of the present invention include; a flexible printed circuit board (FPCB) having line patterns formed on a base film, such as a tape carrier package (TCP) or a chip on film (COF) package. The film substrate used in the embodiments of the present invention has a structure wherein a line pattern layer and internal leads connected thereto are connected to a thin film formed of an insulating material such as polyimide. The film substrate may include a film substrate employing a tape automated bonding (TAB) technology that collectively bonds bumps previously formed on a semiconductor chip with the internal leads of the film substrate.

FIG. 3 is a schematic plan view of a semiconductor chip 200 according to one embodiment of the present invention. Referring to FIG. 3, semiconductor chip 200 comprises a core area 250 in which a number of integrated circuits are formed and a peripheral area 270 in which input pads (or terminals) 210a and 210b, and output pads 230 are formed. Although semiconductor chip 200 is illustrated as a rough quadrangular shape in FIG. 3, semiconductor chips used within embodiments of the present invention is not limited to only this shape but may have various shapes.

Peripheral area 270 is formed around the outer edges of semiconductor chip 200 to encompass (wholly or in part) core area 250. Input pads 210a and 210b and the output pad 230 are successively arranged around peripheral area 270. In the illustrated example, Input/Output (I/O) pads (or alternatively terminals) are variously arranged along all four outer edges of semiconductor chip 200. "First" input pads 210a provide various input signals to integrated circuits 260. "Second" input pads 210b provide power to integrated circuits 260.

In the illustrated embodiment, first input pads 210a and second input pad 210b are disposed proximate different edges of semiconductor chip 200, (e.g., proximate opposite edges). Referring to FIG. 3, first input pads 210a are disposed along a lower edge of semiconductor chip 200, and second input pad 210b are disposed along an upper edge of semiconductor chip 200. The lower edge of the semiconductor chip 200 in this context refers to an edge proximate the input side of semiconductor 200 or adjacent to a side adapted to connect a printed circuit board (hereinafter, this edge will be referred to as an 'input side edge'). The upper edge of the semiconductor chip 200 refers to an edge proximate the output side of semiconductor chip 200 or adjacent to a side adapted to connect a display panel (hereinafter, this edge is referred to as an 'output side edge').

With reference to the illustrated example shown in FIG. 3, first input pads 210a are successively disposed in a central portion of the input side edge of semiconductor chip 200. Output pads 230 may be disposed along the output side edge of semiconductor chip 200. Output pads 230 may also be disposed along other edges of semiconductor chip 200, including the input side edge, and/or either or both of the left and right side edges (hereinafter, referred to lateral side edges). In the illustrated example, output pads 230a include output pads 230a disposed along the input side edge, output pads 230b disposed along the lateral edges, and output pads 230c disposed along the output side edge. If only a relatively few output pins are required by a particular design, some of these output pads may be selectively omitted from the input side edge, either or both of the lateral side edges and/or the output side edge.

Figure 2:
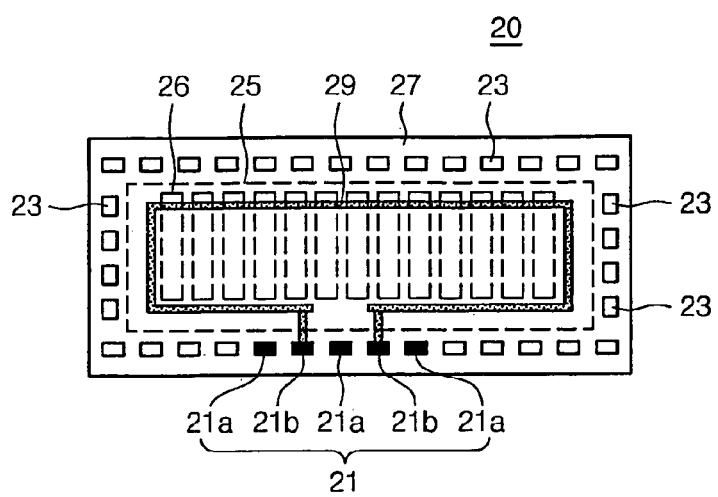
FIG. 2 is a schematic plan view of a semiconductor chip constituting the COF semiconductor chip package of FIG. 1.

A power supply line 290 adapted to provide power to integrated circuits 260 within core area 250 is connected to at least one second input pad 210b disposed on the output side edge. As compared to power supply line 29 of the conventional semiconductor chip shown in FIG. 2, power supply line 290 according to the illustrated embodiment of the invention has a much more restricted geometry (e.g., length), and thus occupies a much smaller amount of the available surface area associated with semiconductor chip 200. As an alternative to the illustrated example, when semiconductor chip 200 is laid out with a relatively long lateral length (i.e., the horizontal direction in the drawings), a number of second input pads 210b may be formed to provide a more stable power supply arrangement. That is, a plurality of second input pads 270b adapted to supply power to integrated circuits 260 may be disposed at regular intervals along the length of semiconductor chip 200.

Within such configurations, a second input pad 210b disposed on the output side edge of semiconductor chip 200 may be electrically connected to one of the first input pads 210a disposed on the input side edge. (See, for example, input pad 210ab of FIG. 5A, hereinafter referred to as a "third" input pad). Because power is supplied to integrated circuits 260 through second input pad 210b, third input pad 210ab need not be electrically connected to integrated circuits 260. The electrical connection between third input pad 210ab and second input pad 210b may be made by an input line formed on the film substrate. This will be described in more detail with reference to FIG. 5A.

FIG. 4 is a schematic view of a film substrate 300 according to an embodiment of the invention. The dotted line 201 shown in FIG. 4 indicates a location wherein semiconductor chip 200 may be mounted on film substrate 300. Referring to FIG. 4, film substrate 300 includes a base substrate 301 formed from an organic material such as polyimide, input lines 310 and output lines 330 formed on base substrate 301 and corresponding to first input pads 210a and output pads 230 of semiconductor chip 200. I/O lines 310 and 330 may be formed from a thin metal (or conductive) layer using conventionally understood patterning and etching techniques. The thin metal film may be formed using such techniques as casting, laminating, electroplating, and the like. Casting is a method of pouring and thermally hardening an insulating film such as liquid polyimide on a rolled copper thin film. Laminating is a method of placing a rolled copper thin film on an insulating film such as polyimide and heat-pressing the same. Electroplating is a method of forming a copper thin layer using by depositing a copper seed layer on an insulating film such as polyimide, placing the insulating film into an electrolyte solution containing copper ions, and then applying an electrical potential to the seed layer.

Input lines 310 and output lines 330 of film substrate 300 extend in opposite directions from a mounting area 201 for semiconductor chip 200 and may be adapted to electrically connect to a PCB and a display panel, respectively. In the illustrated example of FIG. 4, input lines 310 extend from mounting area 201 to the lower edge of film substrate 300, and output lines 330 extend from mounting area 201 to the upper edge of film substrate 300.

In the context of the illustrated embodiment, input lines 310 include input signal lines 310a adapted to supply various input signals to integrated circuits 260, and power supply input lines 310b adapted to provide power. Power supply input lines 310b extend from the lower edge of film substrate 300 and are adapted to connect second input pad 210b of semiconductor chip 200 proximate the output side edge. For the convenience in description, the portion of power supply input line 310b, extending beyond the lower edge of semiconductor 200 toward output lines 330 will be referred to as an extension portion 310be. Within this configuration, power supply input lines 310b extend further into mounting area 202 than input signal input lines 310a. Also, power input lines 310b may be longer than output lines 330 within mounting region 201 of film substrate 300. As mentioned above, power supply input line 310b extends toward output lines 330 in order to electrically connect second input pad 210b. It should be noted that the foregoing arrangements of input and output lines on film substrate 300 do not affect the layout dimensions of semiconductor chip 200. Further, the formation of extension portion 310be does not require any additional fabrication processing as the thin copper film used to form extension portion 310ab may be etched at the same time and using the same fabrications processes required to form the I/O lines and power supply input line 310b.

Figure 5A:
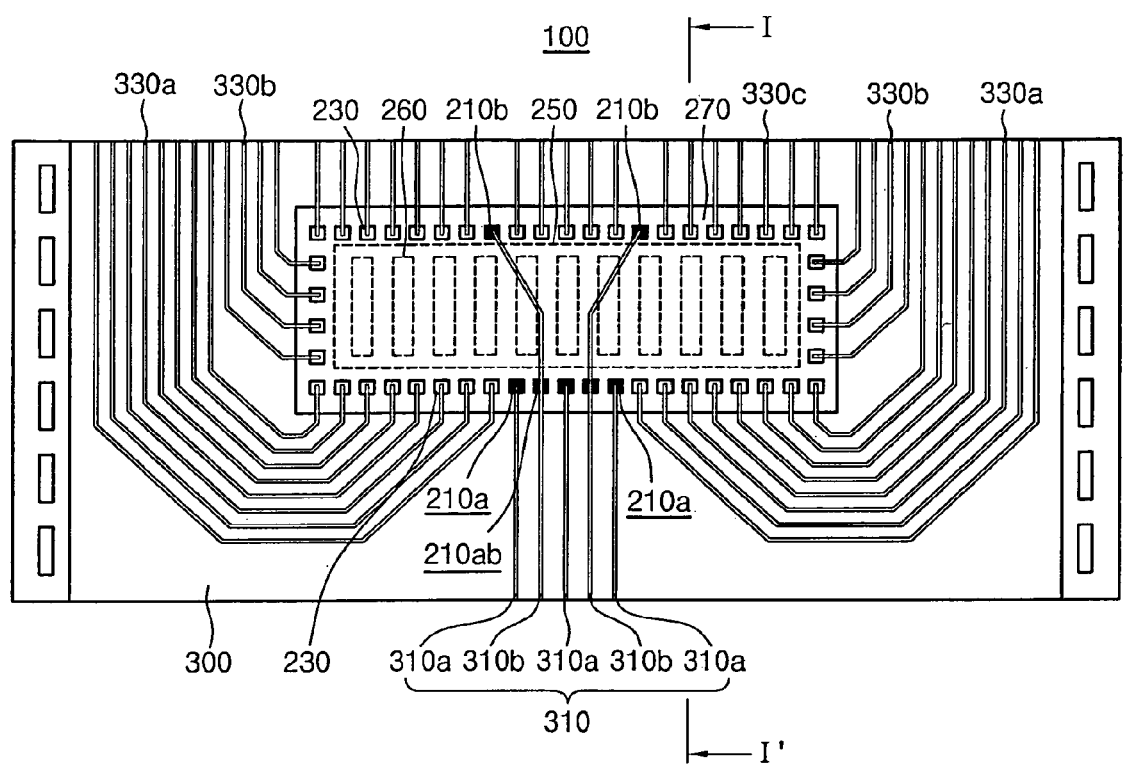
FIG. 5A is a schematic plan view of the COF semiconductor chip package according to one embodiment of the present invention.
Figure 5B:
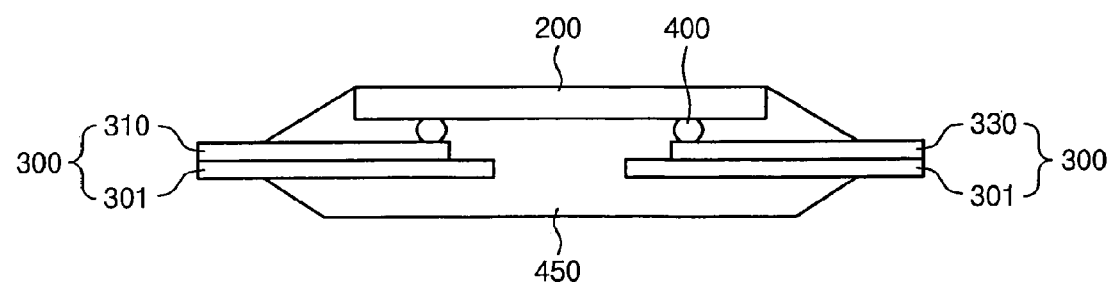
FIG. 5B is a schematic cross-sectional view taken along line I-I' of FIG. 5A, illustrating the semiconductor chip package.

Referring to FIGS. 5A and 5B, a COF semiconductor chip package 100 according to one embodiment of the present invention will now be described. FIG. 5A is a schematic plan view of the COF semiconductor chip package according to one embodiment of the present invention, and FIG. 5B is a schematic cross-sectional view taken along line I-I' of FIG. 5A, illustrating the semiconductor chip package.

Referring to FIG. 5A, semiconductor chip package 100 may use semiconductor chip 200 of FIG. 3 and film substrate 300 of FIG. 4, and may be formed by bonding semiconductor chip 200 to film substrate 300 using one of any number of conventional techniques, such as bump soldering. Output lines 330 of film substrate 300 are connected to the corresponding output pads 230 of semiconductor chip 200. Input signal lines 310a are connected to the corresponding first input pads 210a of semiconductor chip 200. Power supply input lines 310b, and specifically their respective extension portions, are connected to corresponding second input pads 210b of semiconductor chip 200. In the illustrated embodiment, power supply input line 310b may be connected to second input pad 210b through third input pad 210ab.

That is, power supply input line 310a extends from the input side edge of semiconductor chip 200 across core area 250 to be electrically connected to second input pad 210b disposed proximate the output side edge. Also, power supply input line 310a may be electrically connected to third input pad 210ab at the input side edge of semiconductor chip 200.

Referring to FIG. 5B, a cross section of the semiconductor chip package according to the present invention will now be described. In FIG. 5B, semiconductor chip 200 is physically and electrically connected to input lines 310 and output lines 330 via a contact member 400. Contact member 400 may be formed from a metal bump formed from, for example, a conductive material such as gold, copper, solder, or the like. Portions of the I/O lines, excluding points of electrical connection, may be covered with a protective layer that adds strength and mechanical stability to the I/O lines formed on film substrate 300. The protection layer may be formed from a solder resist, a polyimide layer, a polyurethane layer, or the like.

An insulating resin 450 is formed at portions where the I/O lines are coupled with the I/O pads in order to protect these connections. Insulating resin 450 may be an epoxy resin or a silicon resin.

However, in contrast to the foregoing, second input pad 210b may be formed on edges other than the output side edge using various layouts and fabrication techniques. Such alternatives will now be described with reference to FIGS. 6 and 7.

Figure 6:
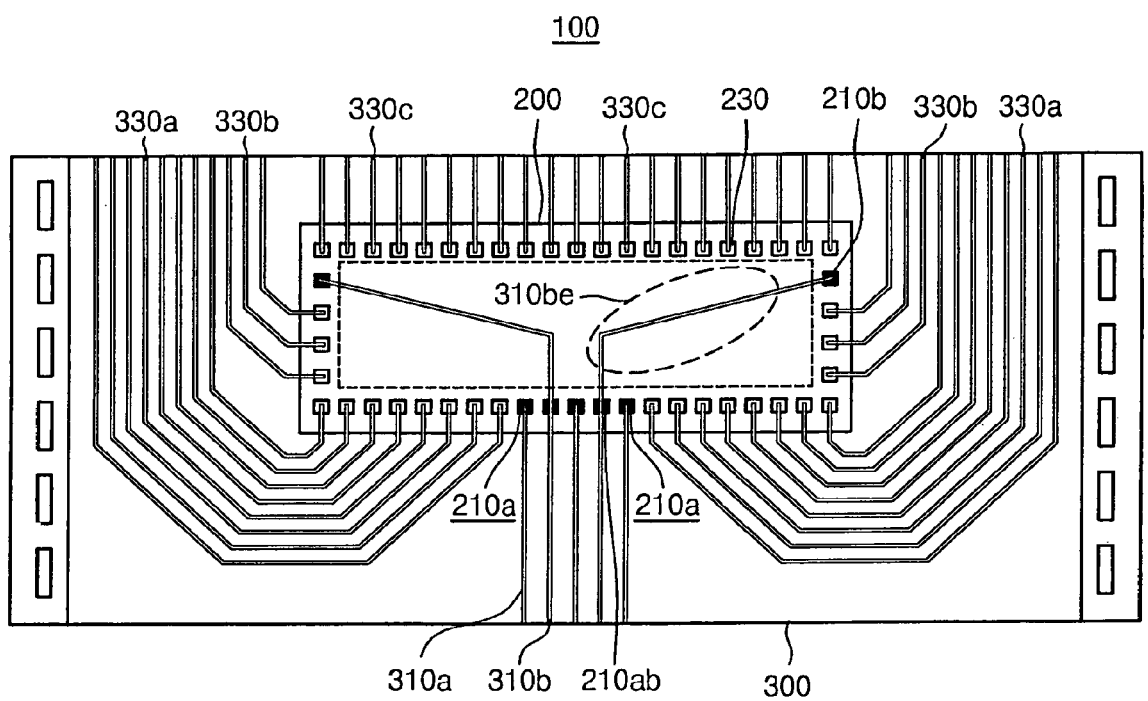
FIG. 6 is a schematic plan view of a semiconductor chip package according to another embodiment of the present invention.

FIG. 6 is a schematic view of a semiconductor chip package 100 according to another embodiment of the invention. A semiconductor chip package 100 like the one described with reference to FIGS. 3 through 5, except for the layout of second input pads 210b, may be used in this embodiment.

However, in the illustrated embodiment, a plurality of second input pads 210b are provided proximate to both lateral side edges of semiconductor chip 200. In this context, power supply input line 310b includes an extension portion 310be extending to a respective lateral side edge of semiconductor chip 200 to be electrically connected to a second input pad 210b. Unlike power supply line 290 of FIG. 3, a power supply line according to the present embodiment is connected to second input pads 210b formed on opposing lateral side edges of semiconductor chip 200. Also, in the present embodiment, the position of second input pads 210b on a lateral side edge of semiconductor chip 200 may be formed in close proximity to integrated circuits 260 while yet allowing connection with corresponding power supply voltages. For example, in the present embodiment, second input pads 210b may be formed at an upper portion of a lateral side edge of semiconductor chip 200.

Figure 7:
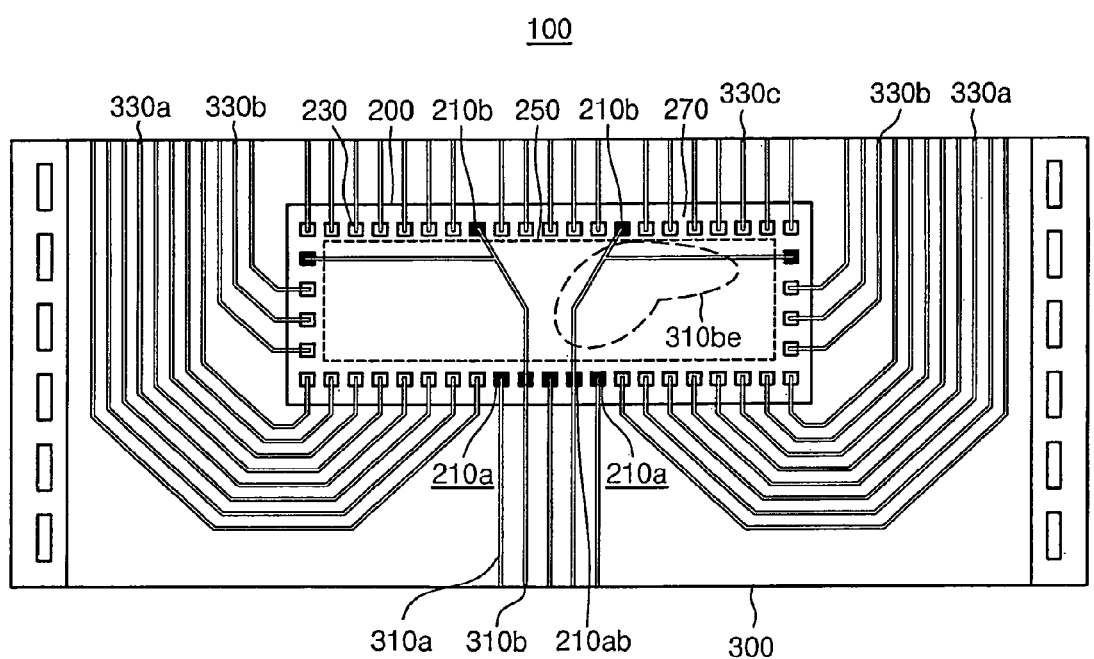
FIG. 7 is a schematic plan view of a semiconductor chip package according to another embodiment of the present invention.

FIG. 7 is a schematic view of a semiconductor chip package 100 according to another embodiment of the present invention. In the semiconductor chip package 100 of the present embodiment, second input pads 210b are formed on the output side edge as well as the lateral side edges of semiconductor chip 200. In the present embodiment, a power supply input line 310b formed on film substrate 300 has an extension portion 310be extending toward a respective lateral side edge and the output side edge of semiconductor chip 200 so as to electrically connect multiple second input pads 210b.

The semiconductor chip packages according to the embodiments of the present invention may be usefully used to package a semiconductor chip requiring a large number of pins.

One application example wherein a semiconductor chip package according to one of the foregoing embodiments may be particularly applied to a LCD display device connection will now be described with reference to FIG. 8.

Figure 8:
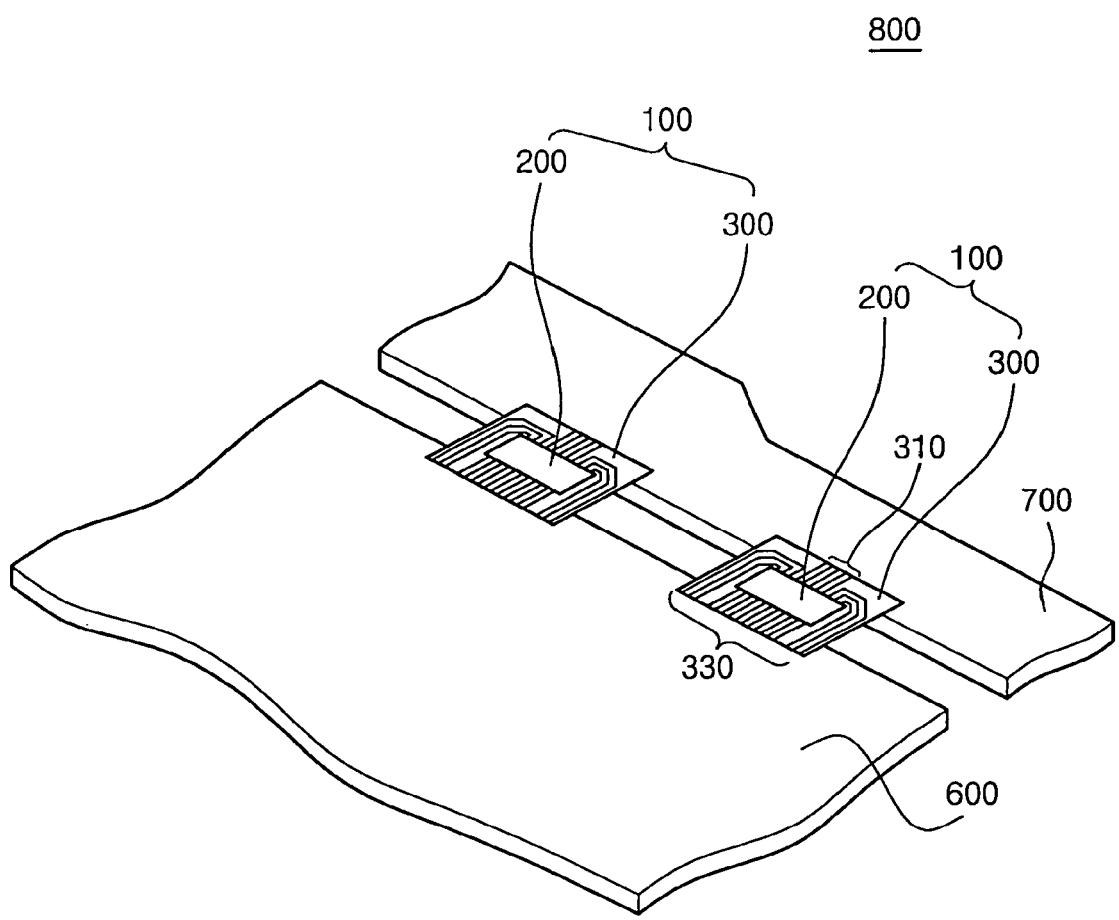
FIG. 8 is a schematic view illustrating a display device employing the semiconductor chip package according to one embodiment of the present invention.

Referring to FIG. 8, a liquid crystal display device 800 includes a semiconductor chip package 100, a display panel 600, and a printed circuit board 700. Display panel 600 is connected to output lines 330 of semiconductor chip package 100, and printed circuit board 700 is connected to input lines 310. Semiconductor chip package 100 is connected to display panel 600 and printed circuit board 700 through an anisotropic conductive film (ACF).

Display panel 600 includes a plurality of gate lines, a plurality of data lines crossing the gate lines, and pixels formed at intersections between the gate lines and the data lines. Each pixel includes a thin film transistor having a gate electrode and a source electrode connected to the gate line and the data line, respectively.

Semiconductor chip 200 of semiconductor chip package 100 includes driving circuits adapted to drive display panel 600. Conventional drive circuits include a gate driver adapted to drive gate line(s) of display panel 600 and a data driver adapted to drive data line(s). In the drawing, semiconductor chip package 100 in which the data driver is mounted is illustrated.

Printed circuit board 700 may includes a timing control unit controlling drive timing of the gate driver and the data driver, and a power supply unit supplying power required by the display panel and the drive circuits. Thus, printed circuit board 700 may be used to control the data driver and the gate driver of semiconductor chip 200 in semiconductor chip package 100. The timing control unit controls data signals to be synchronized with timing required by the gate driver and the data driver, and outputs the signals. Also, the timing control unit outputs various control signals for controlling the gate driver and the data driver.

The power supply unit may be used to generate the various voltages required to operate the LCD display device. The voltages generated by the power supply unit include a common voltage, a gate ON voltage, and a gate OFF voltage.

The gate lines are sequentially selected by the gate driver, and the gate ON voltage is applied to the selected gate line in the form of pulses. Then, the thin film transistor of the pixel connected to the gate line is turned ON, and a voltage including pixel information is applied to each data line by the data driver.

The data driver outputs a data line drive signal for driving the data lines disposed on the display panel 600, in response to a control signal inputted from the timing control unit and a power voltage inputted from the power supply unit.

According to the foregoing embodiments of the present invention, the layout or surface area of a semiconductor chip required to accommodate a power supply line may be reduced, thereby achieving high integration of the semiconductor chip and a semiconductor chip package using the same.

Also, the semiconductor chip package according to the present invention may be particularly useful for a display device that requires a large number of pins such as a liquid crystal display device.

It will be apparent to those skilled in the art that various modifications and variations may be made to the foregoing embodiments. Thus, it is intended that the present invention, as defined by the following claims, cover such modifications and variations.

What is claimed is:

1. A semiconductor chip package comprising:
a film substrate comprising a plurality of input lines and a plurality of output lines formed thereon; and
a semiconductor chip mounted on the film substrate, the semiconductor chip including a circuit, a plurality of input pads and a plurality of output pads respectively connected to the input lines and the output lines,
wherein the input pads comprise a plurality of first input pads arranged along a first side of the semiconductor chip, and one or more second input pads arranged along one or more of remaining sides other than the first side,
wherein the circuit is electrically connected to at least two of the second input pads to receive a respective substantially constant voltage from the at least two of the second input pads; and
wherein the plurality of input lines comprise a first input line which extends from the first side of the semiconductor chip to a first remaining side of the one or more remaining sides, the first input line connecting to a first input pad and one of the at least two second input pads arranged along the first remaining side.

2. The semiconductor chip package of claim 1, wherein the at least two second input pads and the plurality of first input pads are respectively disposed proximate opposite sides of the semiconductor chip.

3. The semiconductor chip package of claim 2, wherein the at least two second input pads are located on a same side of the semiconductor chip and adapted to supply power to the semiconductor chip and separated from each other by at least one intervening output pad.

4. The semiconductor chip package of claim 3, wherein the power has a magnitude greater than zero.

5. The semiconductor chip package of claim 3, further comprising a power supply line connected to the at least two second input pads and arranged proximate a side opposite the first side of the semiconductor chip.

6. The semiconductor chip package of claim 1, wherein the constant voltage has a magnitude greater than zero.

7. The semiconductor chip package of claim 1, wherein the circuit is electrically connected to the at least two second input pads to receive no signals from the at least two second input pads.

8. The semiconductor chip package of claim 1, wherein the circuit is electrically connected to receive a substantially constant voltage from some of the first input pads, and is electrically connected to receive signals from others of the first input pads.

9. The semiconductor chip package of claim 1, wherein the plurality of output pads are disposed proximate the first side, a second side of the semiconductor chip opposite to the first side, and lateral sides interposed between the first side and second side of the semiconductor chip.

10. The semiconductor chip package of claim 9, wherein the at least two second input pads are disposed proximate the second side of the semiconductor chip, and the plurality of first input pads are disposed proximate the first side of the semiconductor chip.

11. The semiconductor chip package of claim 9, wherein the at least two second input pads are disposed proximate to both lateral sides of the semiconductor chip, and the plurality of first input pads are disposed proximate the first side of the semiconductor chip.

12. The semiconductor chip package of claim 9, wherein the at least two second input pads are disposed proximate to both lateral sides and the second side of the semiconductor chip, and the plurality of first input pads are disposed proximate the first side of the semiconductor chip.

13. The semiconductor chip package of claim 1, wherein the plurality of input pads comprise at least two third input pads connected to the at least two second input pads by at least two input lines.

14. The semiconductor chip package of claim 13, wherein each of the at least two input lines electrically connected to the at least two third input pads and the at least two second input pads has at least one bent portion.

15. The semiconductor chip package of claim 1, wherein the circuit includes a plurality of display driver circuits having outputs to drive a display.

16. The semiconductor chip package of claim 15, wherein each of the display driver circuits includes at least one of a gate driver having an output to drive a gate line and a data drive having an output to drive a data line.

17. A semiconductor chip package comprising:
a film substrate having formed thereon a plurality of input lines and a plurality of output lines; and
a semiconductor chip mounted on the film substrate and including a circuit, a plurality of input pads, and a plurality of output pads respectively connected to the input lines and the output lines,
wherein the input pads comprise a plurality of first input pads arranged along one side of the semiconductor chip, and one or more second input pads arranged along one or more of the remaining sides other than the one side;

wherein the plurality of first input pads comprise at least two third input pads that are electrically connected to the second input pads by at least two sub-lines of the input lines, the at least two sub-lines crossing from the one side to one or more of the remaining sides of the semiconductor chip;

wherein the circuit is electrically connected to at least two of the second input pads to receive a first respective substantially constant voltage from the at least two of the second input pads, and receives no data signals from the at least two of the second input pads; and wherein the circuit is electrically connected to receive a second substantially constant voltage from some of the first input pads other than the third inputs pads and is electrically connected to receive signals from others of the first input pads other than the third input pads.

18. The semiconductor chip package of claim 17, wherein the at least two third input pads are not directly electrically connected to the circuit.

19. The semiconductor chip package of claim 17, wherein an electrical connection of the at least two third input pads to the circuit is only through the at least two sub-lines.

* * * * *